United States Patent [19]
Cavallaro

[11] Patent Number: 6,082,289
[45] Date of Patent: Jul. 4, 2000

[54] LIQUID DISPENSING SYSTEM WITH CONTROLLABLY MOVABLE CARTRIDGE

[75] Inventor: William A. Cavallaro, Bradford, Mass.

[73] Assignee: Speedline Technologies, Inc., Haverhill, Mass.

[*] Notice: This patent issued on a continued prosecution application filed under 37 CFR 1.53(d), and is subject to the twenty year patent term provisions of 35 U.S.C. 154(a)(2).

[21] Appl. No.: 08/518,986

[22] Filed: Aug. 24, 1995

[51] Int. Cl.$^7$ .............................. B05C 1/16; B65D 83/00
[52] U.S. Cl. ...................... 118/300; 222/399; 118/243; 118/263
[58] Field of Search ..................... 118/669, 681, 118/683, 684, 300, 313, 324, 243, 263; 222/185.1, 182, 180, 181, 336, 372, 385, 399; 239/88; 349/87, 88, 135; 364/269, DIG. 1

[56] References Cited

U.S. PATENT DOCUMENTS

| 4,646,676 | 3/1987 | Kidder et al. ........................... 118/243 |
| 5,119,973 | 6/1992 | Miller et al. . |
| 5,186,982 | 2/1993 | Biette et al. ........................... 427/256 |
| 5,341,196 | 8/1994 | Hodoshima et al. ................... 141/364 |

OTHER PUBLICATIONS

Hogan, ed. "Adhesive Dispenser Provides 2% Volume Repeatability," Design News, Apr. 11, 1994.

LCC/Dispensit, "Dispensit® Model 1000 Series," (1993).

Camelot Systems, Inc., "CAM/ALOT Liquid Dispensing Systems," Oct. 1994.

ASYMTEK, "A–600 Series Automated Fluid Dispensing Systems," Sep. 1995.

Bouras, Carlos E. and Alec J. Babiarz, "Adhesive Dispensing for Flip Chip–on–Board," Electronic Packaging & Production, (Oct. 1995).

Universal Instruments Corporation, "GDM1," Surface Mount (1994).

Engel, Jack, "Selecting The Proper Dispensing Tip," Surface Mount Technology (Oct. 1990).

ADM Options, "Optional Equipment for ADM–Automatic Dispensing Systems," Creative Automation (date unknown).

Panasert HD Series, "Three Types of Dispensing Nozzles Support a Wide Range of Chips for Reliable High–Speed Adhesive Application" (date Unknown).

*Primary Examiner*—David A. Simmons
*Assistant Examiner*—Calvin Padgett
*Attorney, Agent, or Firm*—Mintz, Levin, Cohn, Ferris, Glovsky and Popeo, P.C.

[57] ABSTRACT

A liquid dispenser has a pump assembly with a housing and a cartridge that is movable relative to the housing between an upper non-dispensing position and a lower dispensing position. The movement is controlled by the selective introduction of air to create a column of air. The dispenser is otherwise biased downward. The movement of the dispenser can be used to avoid repeated upward and downward movement of a pump assembly. In a pump assembly with multiple dispensers, all but one can be raised while only the dispensing cartridge is lowered.

12 Claims, 7 Drawing Sheets

LIQUID DISPENSING SYSTEM WITH CONTROLLABLY MOVABLE CARTRIDGE

FIELD OF THE INVENTION

This invention relates to a system for dispensing on a medium, such as a printed circuit board, small amounts of liquid at a high rate of speed.

BACKGROUND OF THE INVENTION

In the assembly of surface mount printed circuit boards, many dots of liquid epoxy or solder for connecting components to the circuit boards are dispensed on the circuit boards. These components can include discrete components, such as resistors and capacitors, and integrated circuit chips or chip holders. Commercial dispensing machines typically dispense thousands of dots of such liquid per hour, and are expected to run continuously to achieve high throughput.

Knight Tool Co., Inc., of Haverhill, Mass., the assignee of the present invention, manufactures liquid dispensing systems that use a rotary positive displacement pump assembly. These systems are distributed by Camelot Systems, Inc., under the registered trademark CAM/A LOT®. In a typical dispensing system, a pump assembly is mounted to a moving assembly for moving the pump assembly along three mutually orthogonal axes, typically with three lead screws. To dispense a dot of liquid on a desired location, the moving assembly moves the pump assembly in a horizontal x-y plane and stops it over the desired location. The pump assembly is lowered with a z-axis lead screw along the vertical z-axis until the nozzle is at an appropriate height over the board. The pump assembly dispenses a dot of liquid, and is then raised along the z-axis, moved in the x-y plane to a next desired location, and lowered along the z-axis to dispense a next liquid dot.

A number of different approaches, have been used for dispensing small volumes of liquid as individual dots at a high rate. One approach is embodied in a pump manufactured by the assignee and known as a "Dual-Height Rotary Displacement Pump", described in "Design News", April 1994. In this type of pump, an electromagnetically operated clutch is selectively activated to couple a motor and a dispensing cartridge. The cartridge houses an augering screw in an auger chamber. The clutch has a top plate that is continuously rotated by the motor, and a bottom plate that is rotatably connected through intermediate coupling members, including a metal bellows, to the augering screw in the cartridge. The liquid to be dispensed is held in a vertical, cylindrical syringe, and is provided to the auger chamber under constant low pressure.

A controller selectively provides to the clutch a short, timed, electrical signal that induces magnetic attraction between the top and bottom plates. This attraction causes the plates to be engaged and to rotate together for a short period of time. The rotation by the bottom plate causes the screw to rotate a small amount, thus dispensing a small amount of liquid through a nozzle that is screwed to the cartridge.

The nozzle through which the liquid is dispensed is adjacent a mechanical sensing foot that contacts the medium on which the dot is to be dispensed to define a fixed z-axis displacement between the nozzle and the medium. As the pump assembly is lowered and the foot contacts the medium, the metal bellows is compressed as needed. The z-axis displacement is important because if it is incorrect, the dot can have an incorrect size and shape, and can exhibit one of a number of flaws, such as those known in the industry as tailing, stringing, or mushrooming. Such sensing is particularly important when dispensing on a warped medium.

While some pump models dispense at only one height, this pump model has a dual-height feature that allows the pump to dispense at one of two different heights. An air feed is provided to the cartridge to selectively raise and lower the foot relative to the nozzle and cartridge. When the distance between the end of the nozzle and the end of the foot is increased, a larger dot can be dispensed. This dual-height feature provides added flexibility, but it comes at the expense of some throughput.

Because circuit boards have a number of different types of components, it is often desirable to provide dots that have different volumes of liquid; different profiles, including different diameters and shapes, such as a circular or horseshoe shape; or different types of liquid. While the pump model described above can dispense dots at two different heights to provide different size dots, it can use only one nozzle at a time, and therefore cannot dispense different types of liquids or different shapes.

To accommodate multiple nozzles, there are liquid dispensing systems that have a number of pump assemblies arranged in a line and clamped together. One such system receives liquid from two liquid sources, and dispenses the liquid through two respective assemblies that include two respective motors. Another way that multiple dispensers have been provided is with a model that uses four separate air cylinders to dispense the liquid.

An object of the present invention is to improve the flexibility of a liquid dispensing system.

Another object of the present invention is to improve the throughput of a liquid dispensing system without sacrificing repeatability and accuracy.

SUMMARY OF THE INVENTION

According to the present invention, a pump assembly in a liquid dispensing system has a cartridge that is controllably movable relative to the housing of the pump assembly between an upper non-dispensing position and a lower dispensing position.

In preferred embodiments, the cartridge includes a body connected to a piston, the body and the piston being slidably movable relative to the housing. The housing has an air inlet through which air can be selectively introduced to create an annular column of air between the piston and the body to raise the cartridge upward. The cartridge is otherwise biased downward by a compression spring that pushes the cartridge to the lower dispensing position when air is not introduced.

The ability of the cartridges to move relative to the housing further allows the system to dispense dots with a method that reduces the need to move the entire pump assembly along the z-axis every time a dot is to be dispensed. Rather than moving the pump assembly in the x-y plane and then moving the entire pump assembly vertically along the z-axis to dispense dots, the pump assembly receives air to selectively raise and lower the cartridges to avoid obstacles on the circuit board without the need to raise and lower the entire pump assembly along the z-axis every time a dot is dispensed.

A cartridge that is movable relative to a pump assembly housing can be provided in a pump assembly that has a single cartridge, or can be provided in a pump assembly with multiple cartridges. In a pump assembly with multiple cartridges, the cartridge that is actually dispensing is set at the lower position, while each of the other cartridges is at the upper non-dispensing position. The pump assembly with multiple cartridges can be moved in a similar manner as described above, i.e., each of the cartridges except the one that most recently dispensed is raised to the upper position as the pump assembly is moved, and when positioned in the x-y plane, one of the cartridges is selectively lowered for dispensing. Alternatively, the pump assembly with multiple cartridges can be moved in a manner similar to the prior method of moving (i.e., raising and lowering the pump assembly along the z-axis for each dot), but the ability to move the cartridges relative to the housing is used during dispensing.

The pump assembly of the present invention provides increased throughput without reducing accuracy and repeatably. If the pump assembly is moved in a manner that reduces z-axis movement of the pump assembly, throughput is further increased, while also reducing wear on the z-axis components. Other features and advantages will become apparent from the following description of preferred embodiments when read in conjunction with the drawings, and from the appended claims.

DESCRIPTION OF PREFERRED EMBODIMENTS

Figure 1:
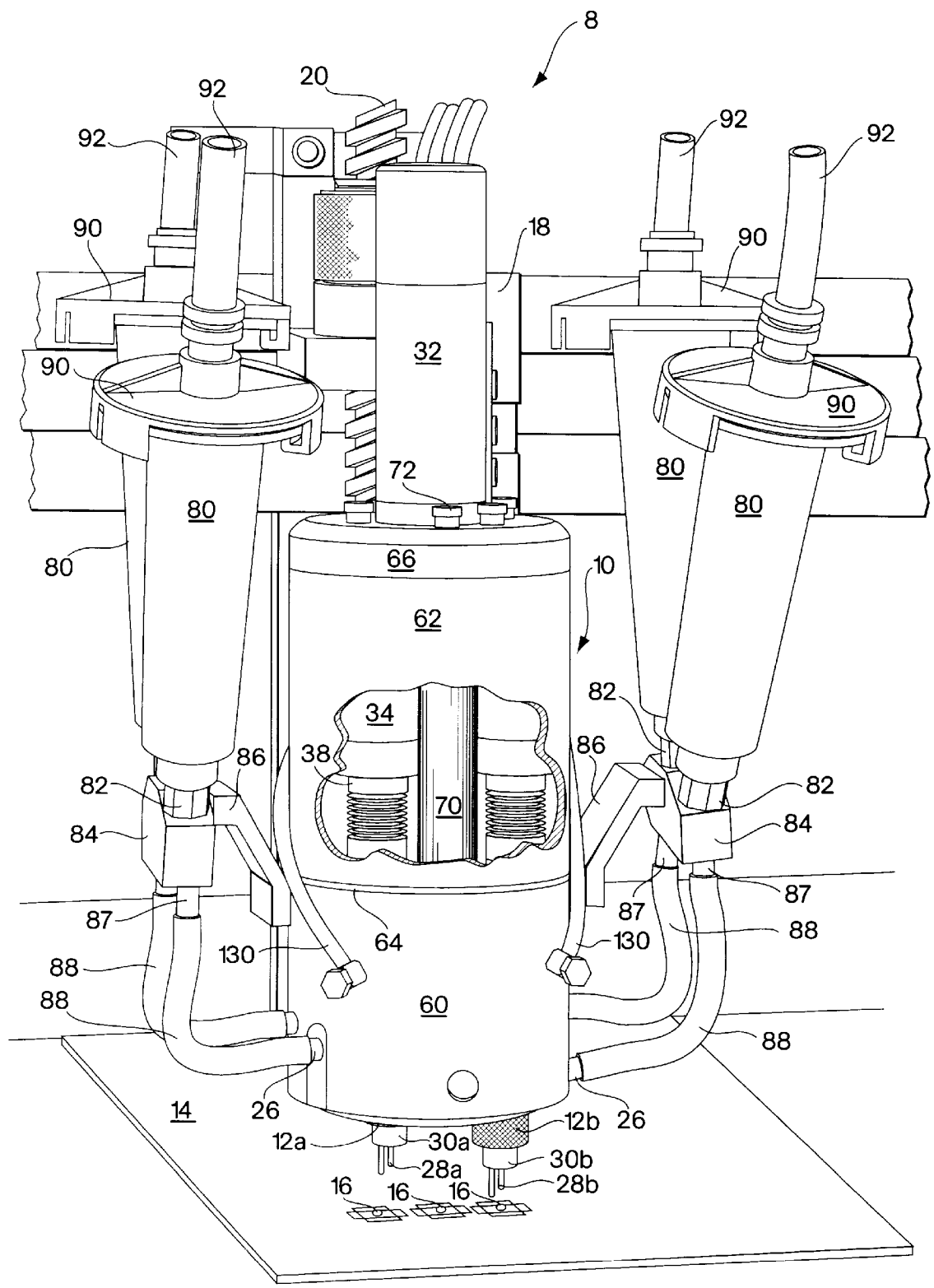
FIG. 1 is a partially cut-away perspective view of a pump assembly according to a first embodiment the present invention.

Referring to FIG. 1, a liquid dispensing system 8 has a pump assembly 10 that houses four cartridges arranged in a square (only two of the cartridges 12a, 12b are shown and identified). Each of the cartridges dispenses on a medium, such as a printed circuit board 14, small dots 16 of a liquid, such as epoxy, solder paste, or silver-filled adhesive. Pump assembly 10 is mounted to a frame 18 for computer controlled movement with lead screws along x, y, and z axes. Z-axis lead screw 20 is used to move the pump assembly vertically (the other lead screws are not shown).

Figure 2:
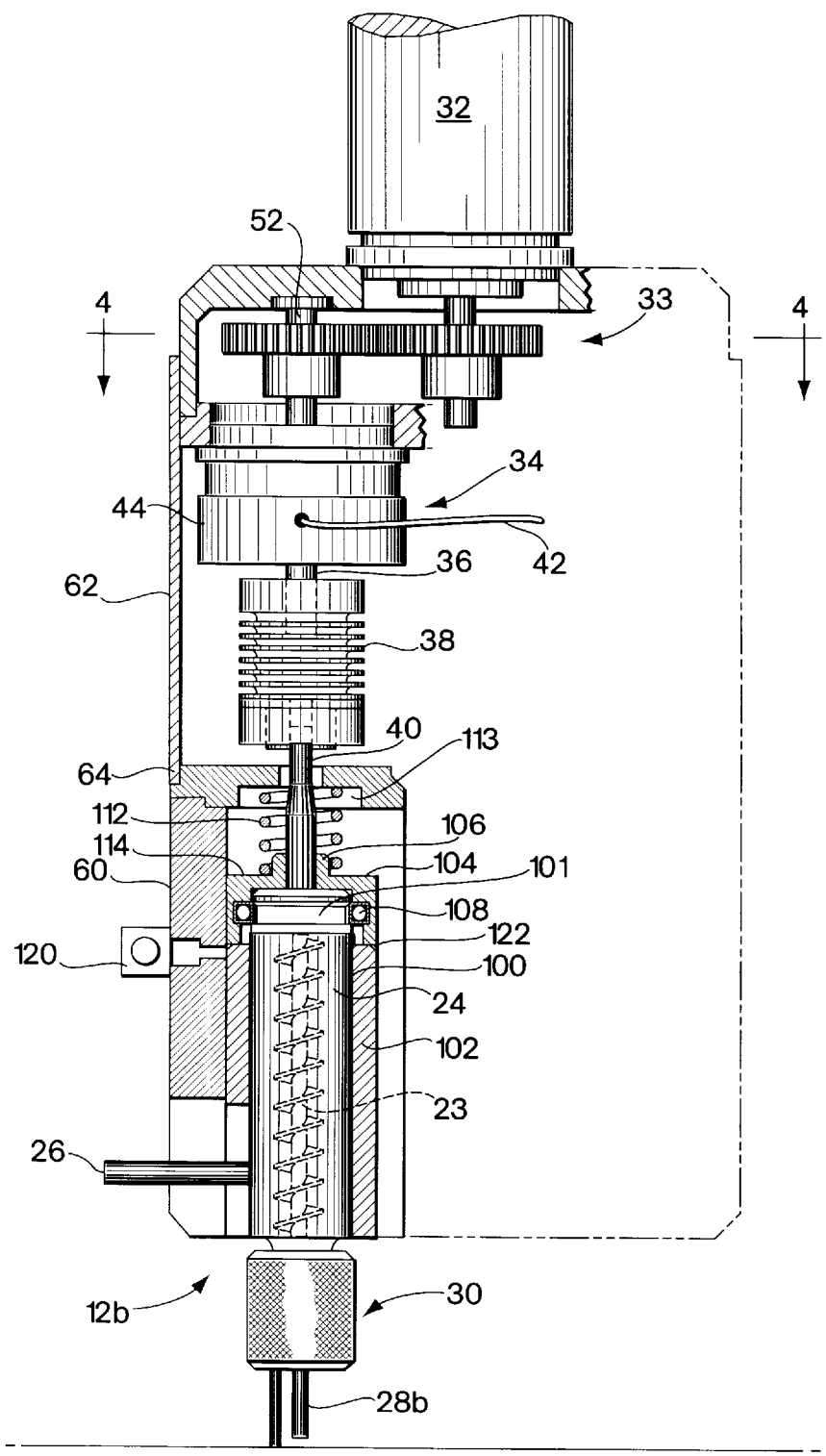
FIGS. 2 and 3 are partial cross-sectional elevational views of the pump assembly of FIG. 1, shown in lowered and partially raised positions, respectively.
Figure 3:
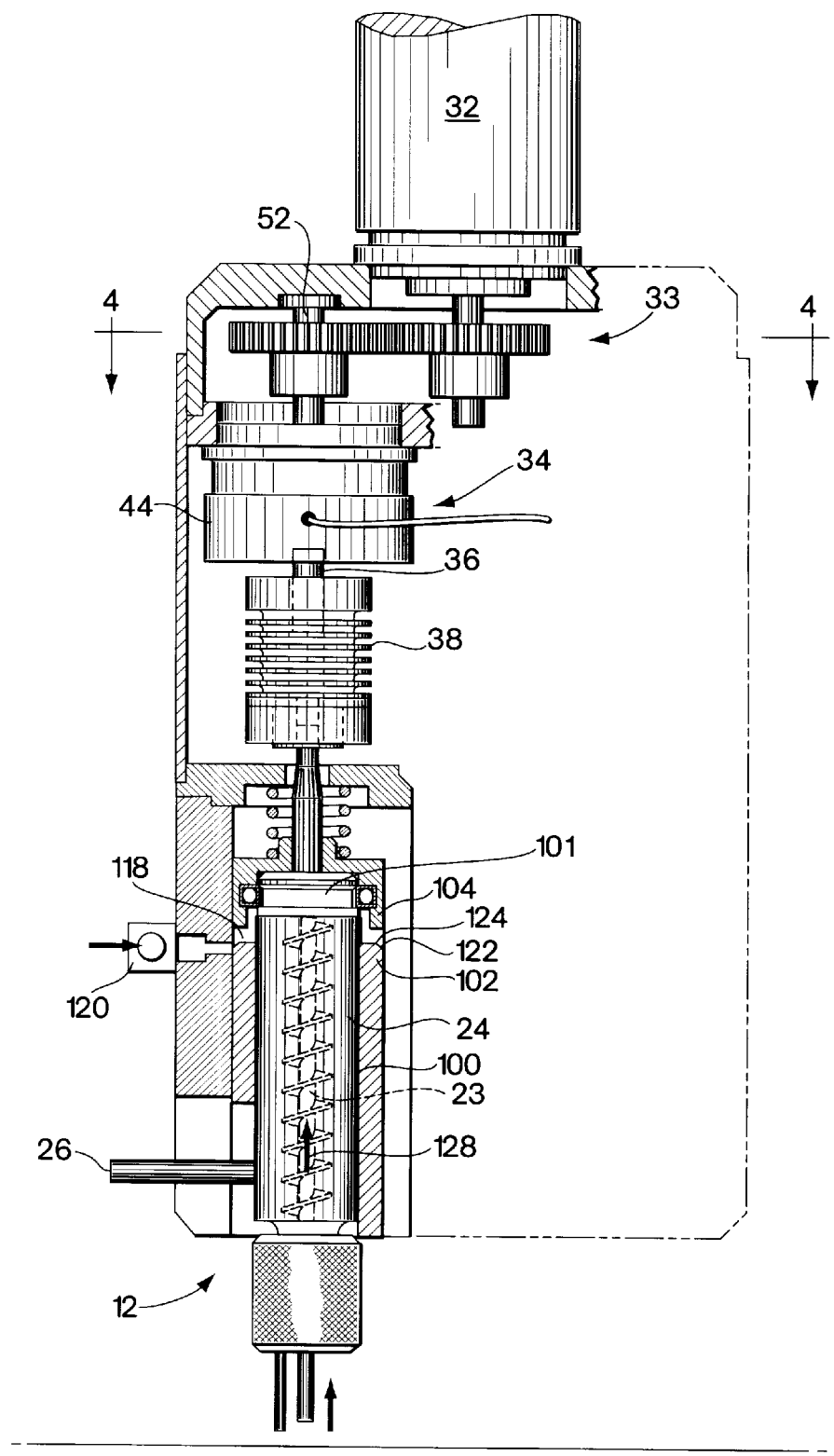

Referring also to FIGS. 2 and 3, each cartridge has an auger chamber 24 that holds a vertically oriented augering screw 23 which is preferably made from one of a number of hardened materials, such as stainless steel, carbide, or ceramic. Auger chambers 24 are each associated with, and fluidly coupled to, a liquid container through a stainless steel liquid feed tube 26. When one of the augering screws is rotated, an amount of the liquid in the auger chamber is forced through a nozzle 28a, 28b in a nozzle assembly 30a, 30b. Each nozzle 28a, 28b can include one or more dispensing needles, which can be appropriately arranged to produce a dot with a desired shape, e.g., round or a horseshoe shape.

All of the augering screws are coupled to a single motor 32 through a gear train 33 and through respective coupling mechanisms. Each of these mechanisms includes a respective clutch 34 that is coupled to gear train 33 and that has an output shaft 36. Output shaft 36 is connected to a metal bellows 38, which in turn is connected to a drive shaft 40 with a female spline in the lower half of bellows 38, and a matching male spline on the top of drive shaft 40. The spline allows vertical movement and rotation, and thus serves as a universal joint. The metal bellows is therefore not needed to serve as a compression spring for the dispenser.

Each clutch 34 has a housing 44 that encloses a top plate that is connected to and continuously rotated by motor 32, and a bottom plate that is connected to the respective output shaft 36. The bottom plate is moved only when it is brought into contact with the top plate (the top and bottom plates are enclosed in the clutch and are not shown). This contact is effected by magnetic attraction induced by an electrical activation signal from a controller. A clutch of this general type is available from Autotronics, Inc., located in Joplin, Mo., as Model C-6-84R (this model is preferably modified in dimensions and also to allow a pair of signal wires to extend through its housing).

Activation signals are provided to clutches 34 through pairs of signal wires 42 that extend through housing 44 of clutch 34. The clutch responds to such an activation signal in about 2 msec to cause the bottom plate of the selected clutch to move into contact with the top rotating plate for a period of time, typically on the order of tens of milliseconds. When the bottom plate rotates, the respective augering screw rotates a small distance, thus dispensing through one of the nozzles a small dot of liquid. The dots should have a consistent and repeatable diameter. Depending on the nozzle used, dots are dispensed at one of a number of diameters in a range of about 0.1 to 0.01 inches.

Figure 4:
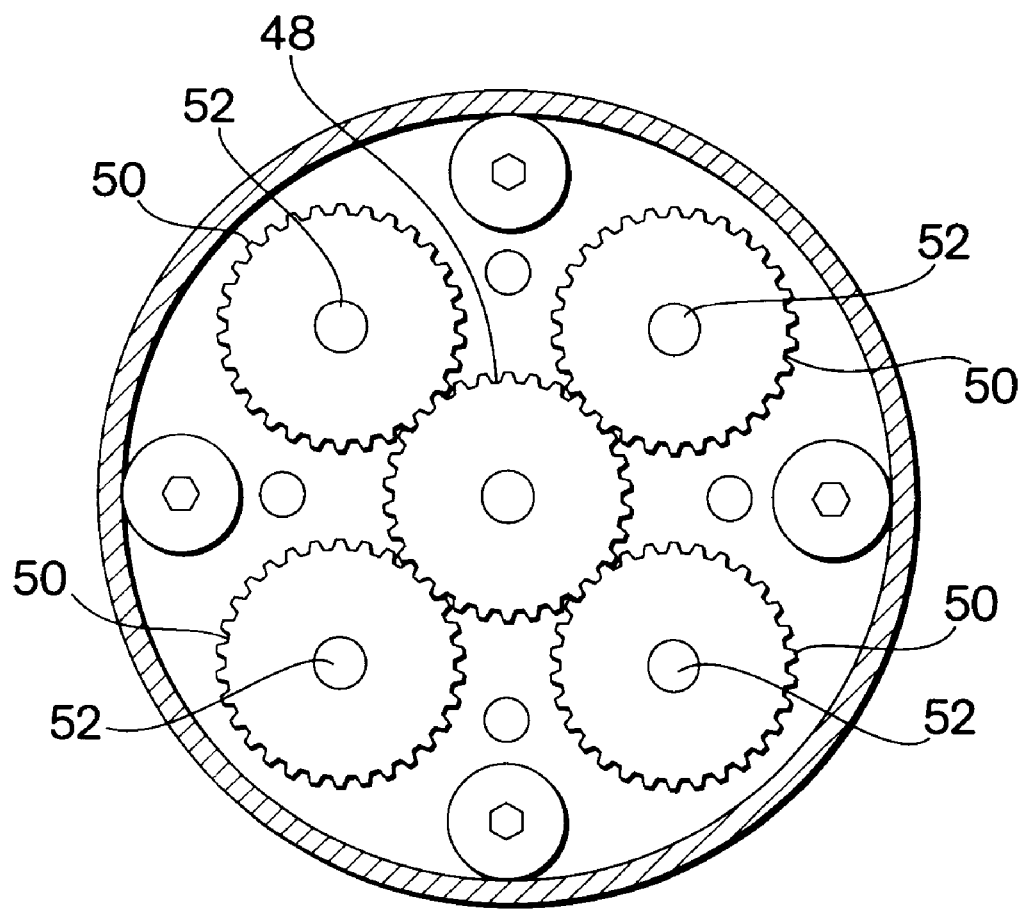
FIG. 4 is cross-sectional view taken through section lines 4–4 in FIGS. 2 and 3.

Referring also to the cross-sectional view of FIG. 4, for single motor 32 to simultaneously drive the top plates of each of the clutches, the motor directly drives a central spur gear 48 that meshes at four equally spaced circumferential positions with four individual spur gears 50. Each of individual spur gears 50 is coupled through an axially oriented cylindrical shaft 52 to a respective top plate of one of clutches 34 to continuously rotate that top plate. Because of this arrangement, multiple cartridges can be driven with one motor, thus reducing the number of parts, the costs of manufacture, and the size of the pump assembly.

Referring again to FIG. 1, cartridges 12 are thus housed together in a single, compact housing structure that includes a lower cover 60, an upper cover 62, a lower lid 64 on top of lower cover 60, and an upper lid 66 on top of upper cover 62. Each of these covers and lids is generally circular or annular in cross-section, but they can have other shapes as shown, for example, in the embodiment of FIG. 7. Cylindrical aluminum standoffs 70, one centered and four distributed about the perimeter (one of which is shown) between couplings 38, are rigidly connected to the upper and lower covers with screws 72 to provide stability. Motor 32 is thus centered over and coupled to upper lid 66.

The containers for holding the liquid to be dispensed are preferably four elongated cylindrical syringes 80, each mounted through a fitting 82 in one of two support blocks 84. Support blocks 84 are connected with brackets 86 to opposite sides of the housing at lower cover 60, and each has two stainless steel feed tubes 87 extending downward. Flexible tubing 88 couples feed tubes 87 and feed tubes 26. The syringes are thus fluidly coupled to auger chambers 24 to provide liquid.

Each syringe 80 is covered with a cap 90 that has a central opening for receiving an air conduit 92 through which low air pressure is provided. The air pressure is provided constantly while the respective cartridges is dispensing, but it can be stopped by a controller after a certain period of non-dispensing time.

During operation, when cartridge 12b with nozzle 28b is dispensing, cartridge 12a with nozzle 28a is raised to an upper non-dispensing position to avoid contact with any components on board 14 or other dispensed dots on the board. To raise the cartridges to this upper position, the cartridges and housing are designed so that each cartridge can be selectively raised and lowered relative to the housing with air pressure. When the pump assembly is moved, all of the cartridges except the one that most recently dispensed, are raised; during dispensing, all but one of the cartridges are raised, the one being the cartridge that is dispensing.

Referring to FIGS. 2 and 3, cartridge 12b has a cylindrical body 100 (enclosing the auger chamber) that is mounted in, and slidable relative to, a bushing 102 that is fixed relative to lower cover (bushing 102 may therefore be considered part of the housing). Over body 100 is a plastic cap 101. A top part of body 100 and plastic cap 101 extend into, and are surrounded by, a piston 104. Piston 104 is generally inverted cup-shaped with a central opening for axially receiving drive shaft 40 (which also extends through an opening in lower lid 64). An integral cylindrically annular portion 106 extends upwardly around the opening and provide stability between piston 104 and shaft 40.

Each of cap 101 and piston 104 has a groove for receiving between them an O-ring 108 that holds cartridge 12b within piston 104. Cartridge 12b can easily be removed from and reinserted into piston 104 by manually snapping body 100 out of piston 104 for cleaning, and then snapping it back into piston 104. This snap-fit allows removal and reinsertion without the need to disconnect any connections or unclamp any other members (except for disconnecting conduit 88 from feed tube 26), such as a set screw or other threaded retainer. Bushing 102 prevents piston 104 from coming out of the housing when body 100 is snapped out.

A compression spring 112 is mounted between lower cover 64 and a top face 114 of piston 104 to bias piston 104, and hence cartridge 12b, to a lower dispensing position. Spring 112 extends downwardly around cylindrically annular portion 106, which thus also positions spring 112, and upwardly into a counterbore 113, which also helps to position and retain spring 112. As an alternative to a spring, a second air inlet can be provided to drive the piston downward, thus avoiding the need for a spring.

Referring to FIG. 3, to raise piston 104 and body 100 together, air is introduced at air intake 120 to define an air region 118 between bushing 102 and piston 104. To receive the air, bushing 102 has a groove 122, at its top outer perimeter facing retainer 86. Groove 122 forms an annular channel 124 with triangular cross-section. Air is controllably introduced through conduits 130 (FIG. 1) and air inlet ports 120 to annular channel 124 to drive piston 104 and body 100 upward in the direction of arrow 128 to an upper non-dispensing position about 0.25 inches above the lower position. FIG. 3 shows a partially raised position, but piston 104 can actually bottom-out against lower lid 64, thus compressing spring 112 within counterbore 113. The air provided at inlet port 120 and the biasing force of compression spring 112 are appropriately balanced so that when the air is introduced, spring 112 is compressed; and when the air is not introduced, cartridge 12b and piston 104 quickly return to the lower position.

Body 100 is preferably made from aluminum with a hard, slippery coating that includes PTFE. Bushing 102 is preferably made from Torlon®, a slippery material used for bearing surfaces. The bearing surface between bushing 102 and body 100 is non-lubricated.

If the pump assembly has multiple nozzle assemblies, when one cartridge is used to dispense a liquid dot, the other cartridge(s) is/are provided with air continuously during dispensing. As a result, only one cartridge is down in the dispensing position. The other cartridges therefore do not contact previously dispensed dots or other obstacles that may be on the medium.

The ability to move the cartridges vertically relative to the housing can be used with pump assemblies with single or multiple cartridges to change the way that the pump assembly is moved to a next location for dispensing. Under controllably introduced air pressure, the piston is used to move the one or more cartridges along the z-axis relative to the rest of the pump assembly, without it also being necessary to use the z-axis lead screw to move the entire pump assembly each time a dot is to be dispensed. As indicated above, prior devices operated with the following steps: move the pump assembly in the x-y plane to a desired location, move the entire pump assembly downwardly along the z-axis, dispense a dot, move the entire pump assembly back upwardly along the z-axis, and move the assembly in the x-y plane to a next desired location.

With the pump assembly and movable dispenser of the present invention (and assuming a single cartridge) the pump assembly first can be set at a desired position along the z-axis, then the following steps are performed: raise the cartridge relative to the rest of the pump assembly, move the pump assembly in the x-y plane, lower the cartridge to a lower dispensing position without moving the rest of the pump assembly, dispense a dot of liquid, raise the cartridge without moving the rest of the pump assembly, and move the pump assembly in the x-y plane to a new location for dispensing. Accordingly, the number of times that the entire pump assembly must be moved in the z-axis is minimized. This method improves throughput and reduces wear on a z-axis motor.

With multiple cartridges, such as four, all the cartridges can be raised simultaneously during movement in the x-y plane, although preferably the one that most recently dispensed is kept in the lower position. During dispensing only one of the cartridges is lowered.

Figure 5:
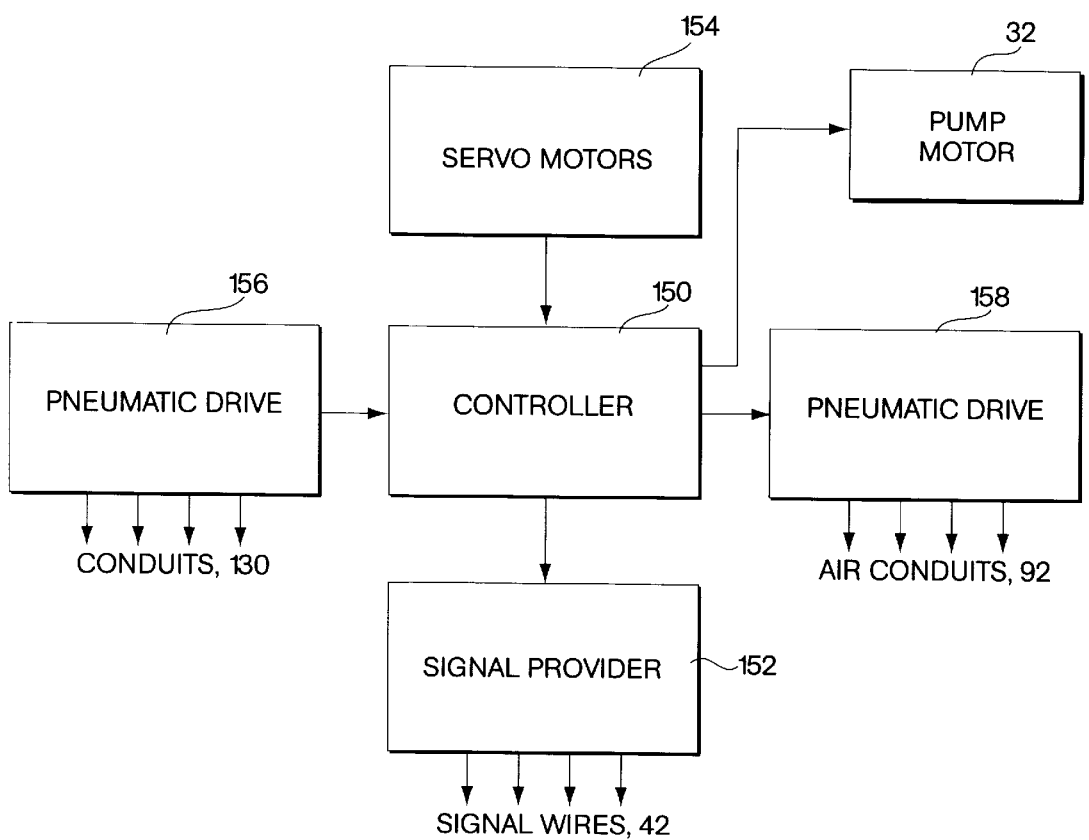
FIG. 5 is a block diagram illustrating a control system according to the present invention.

Referring to FIG. 5, the system of the present invention has a controller 150 for controlling different functions of the liquid cartridge system of the present invention. The controller is preferably implemented with an appropriately programmed personal computer. When a new type of workpiece is provided to the liquid dispensing system (e.g., a new type of printed circuit board), the locations, sizes, and types of liquid that need to be dispensed are entered into the computer, and an optimizing program is run to determine an efficient dispensing sequence for that new application.

When the workpiece is provided to the system, the computer causes electrical activation signals to be provided to the clutches with a signal provider 152; causes signals to be provided to motors, preferably closed-loop servo motors 154, for moving the pump assembly along the x, y, and z axes; and causes signals to be provided to pneumatic drives 156, 158 that provide air through conduits 130 to each of the air inlet ports 120, and through conduits 92 to the syringes. The controller further has other general control functions, such as various alarms and the ability to stop pumps motor 32 or pneumatic drive 158 after some threshold period of time (e.g., ten seconds).

Optimizing programs for controlling the sequences of steps by which dots are dispensed, and control programs for controlling the various inputs to the system are generally known from prior devices, and can be adapted to implement the features of the present invention.

Figure 6:
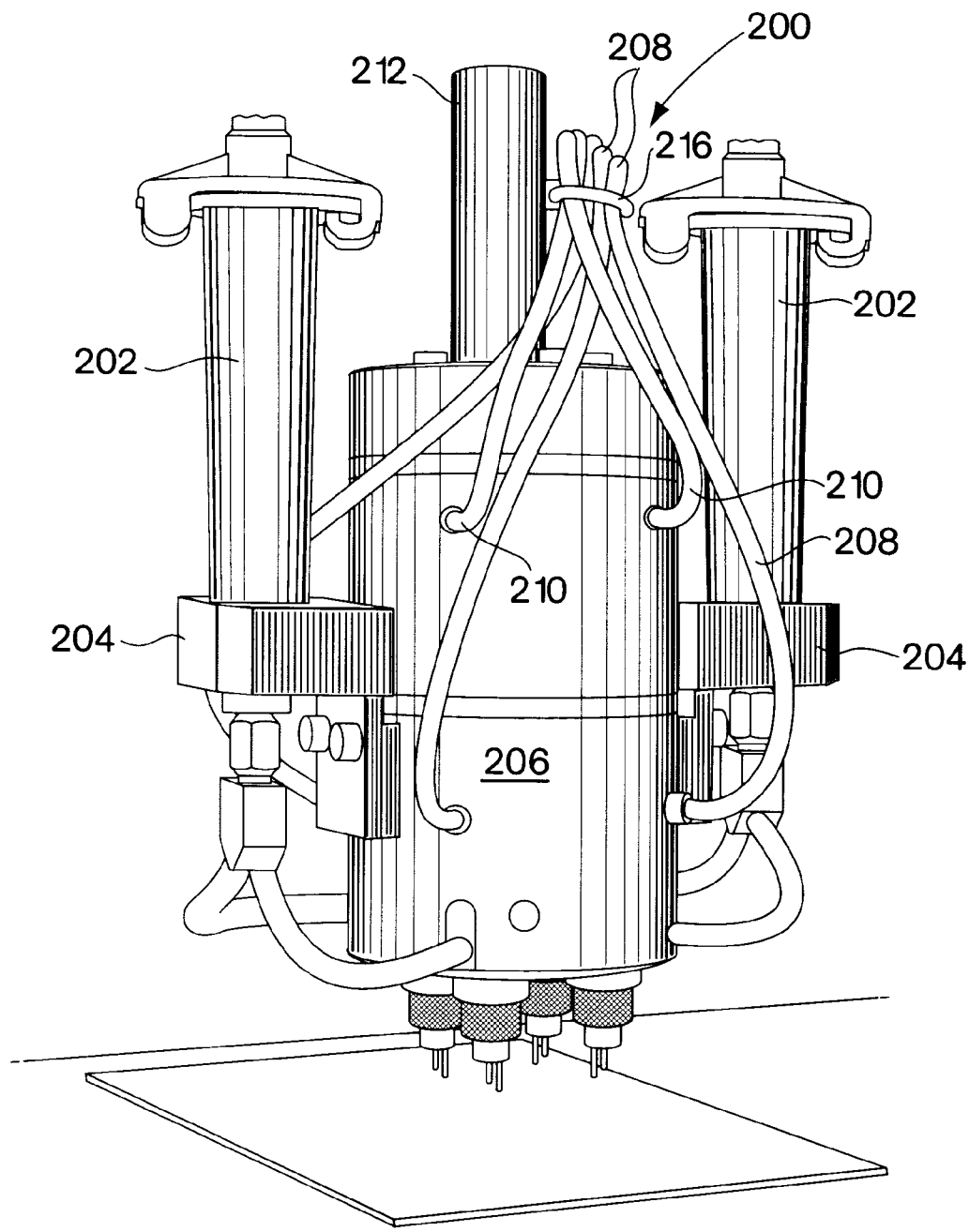
FIGS. 6 and 7 are perspective views of dispensers according to second and third embodiments of the present invention.
Figure 7:
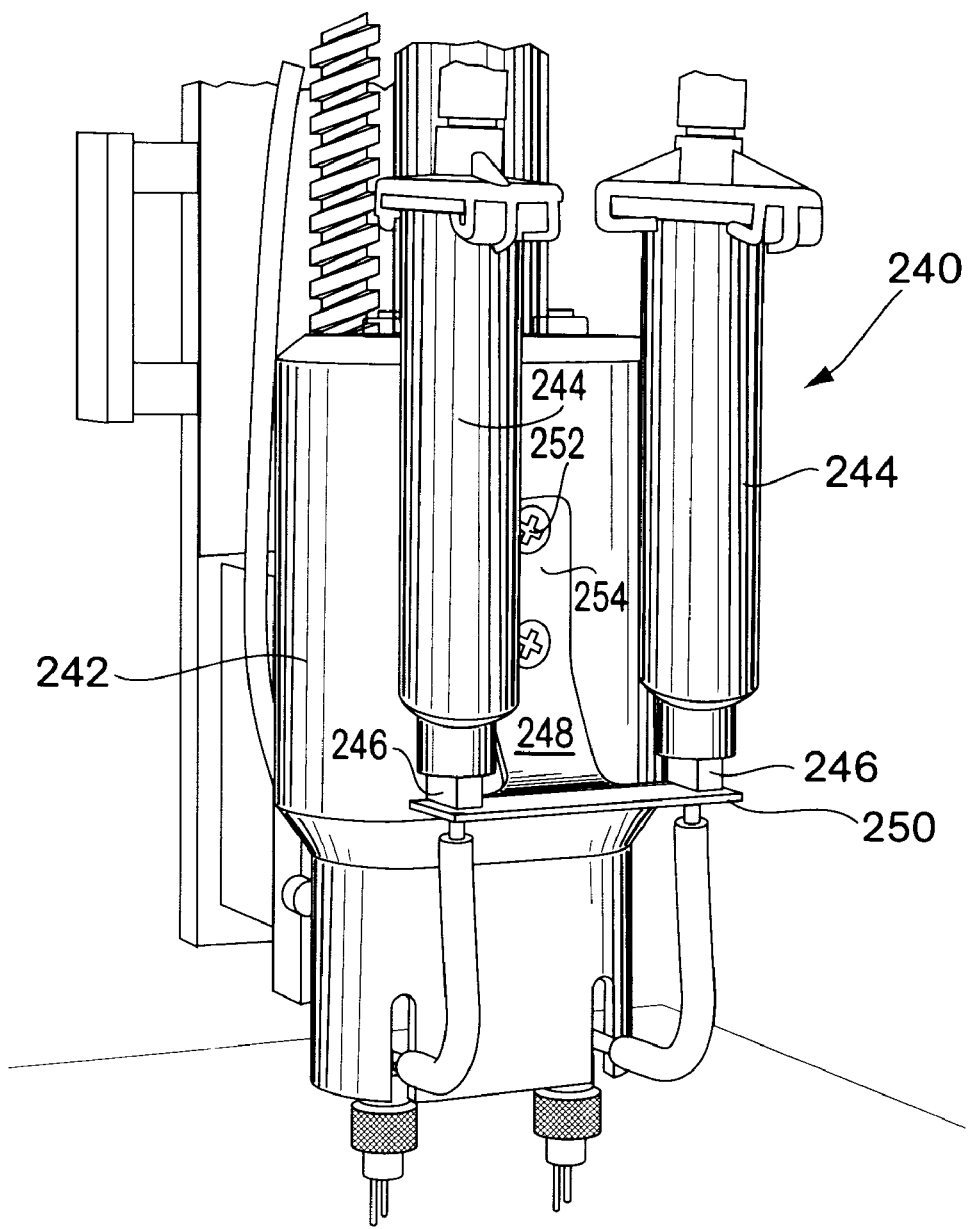

FIGS. 6 and 7 show perspective views of alternative embodiments of a liquid dispenser assembly according to the present invention. As shown in FIG. 6 (a perspective view from the rear), a pump assembly 200 has four cartridges but receives liquid from only two syringes, each of which provides liquid to two nozzles. Each syringe 202 is mounted in an L-shaped bracket 204 that is mounted to a housing 206 of the pump assembly. As shown here, conduits 208 and wires 210 for providing air and electrical signals, respectively, are grouped together with a clip 216 at the rear of motor 212.

In the embodiment FIG. 7, the pump assembly 240 has a housing 242 that is somewhat elongated in length with rounded corners. As shown here, the lower lid can be eliminated and the upper and lower covers effectively combined into one integral body. A pair of syringes 244 are mounted with fittings 246 in a single bracket 248 that has a horizontal tray portion 250 and a vertical portion 254 connected to housing 242 with screws 252. The housing is made from aluminum and has a nickel and PTFE finish. Other aspects of pump assembly 240 are generally similar to those of FIG. 1 with appropriate alterations for two nozzles instead of four.

The dispensing system of the present invention can dispense small dots of liquid at a rate of about 20,000 to 45,000 dots per hour. Because of the individual and selective control of cartridges from the controller via signal wire pairs 42 (FIG. 2), different numbers and sizes of nozzles can be arranged and utilized at one time. For example, the present invention can accommodate 20, 23/25, or 27 gage nozzles to produce dot sizes ranging from 0402 size to PLCC (standard measures in the dispensing field).

Having described an embodiment of the present invention, it should be apparent that modifications can be made without departing from the scope of the invention as defined by the appended claims. While the liquid dispensing system of the present invention has been described for use with printed circuit boards, it can be used for other applications that require a large number of small amounts of liquids to be dispensed individually at a high rate of speed. Such applications are in the semiconductor, medical, and industrial fields. In the medical field, for example, a laboratory may have a large number of slides or test tube with samples of blood, urine, or tissue for testing. The system of the present invention dispenses to the samples small amounts of a activating liquid that causes the sample to change (or not change) to indicate that it meets (or fails) some criterion.

While pump assemblies have been described with two or four nozzles, other numbers of nozzles, such as three or six, can be used. If more than two nozzles is used, it is generally preferred that they be arranged in a two-dimensional array with the motor centrally disposed between them. Other types of drives can be used for moving the pump assembly, such as linear motors.

I claim:

1. A liquid dispensing system for receiving liquid from a liquid source and for dispensing on a medium at a high rate small amounts of the liquid, the system comprising:
   a pump assembly including:
      a housing, and
      a cartridge including a chamber for receiving liquid from the liquid source and a nozzle assembly through which the liquid is dispensed, said cartridge being mounted in said housing and being slideably movable relative to the housing between a lower first position in which said nozzle assembly of said cartridge dispenses the liquid, and an upper second position at which said cartridge does not dispense the liquid, wherein when in the lower first position, the nozzle assembly is spaced a predetermined distance above the medium;
   a controller for controllably causing said cartridge to move between said first and second position; and
   an inlet in the housing for receiving a fluid, the fluid moving said cartridge from said one of said first position and said second position to the other of said first position and said second position when the fluid is introduced, wherein said fluid is a gas;
   wherein the cartridge includes an annular piston and the housing includes an annular bushing around the cartridge, the bushing having an annular face adjacent an annular face of said annular piston when said cartridge is in one of said first and second positions, the fluid increasing a gap between said annular piston and said annular bushing.

2. A liquid dispensing assembly for receiving liquid from a liquid source and for providing metered quantities of the liquid on a medium, the assembly comprising:
   a housing; and
   a cartridge including:
      a chamber;
      an inlet for receiving fluid into the chamber,
      an outlet through which the liquid is dispensed, and
      an augering screw mounted in the chamber for moving the fluid from the chamber to the outlet,
      the cartridge being mounted in the housing and being movable relative to the housing between a lower first position a distance above the medium at which the cartridge dispenses the liquid, and an upper second position further from the medium at which the cartridge does not dispense the liquid, the augering screw being rotated to dispense liquid when the cartridge is in the lower position;
   wherein the bushing, and the cartridge includes an annular member rigidly connected to the augering screw, the assembly further comprising an inlet n the housing for receiving a fluid for altering a gap between the annular bushing and the annular member.

3. The assembly of claim 2, wherein the fluid increases the gap, the assembly further comprising a spring for biasing the annular member and annular bushing together.

4. A liquid dispensing system for receiving liquid from a liquid source and for dispensing on a medium at a high rate small amounts of the liquid, the system comprising:
   a pump assembly including:
      a housing, and
      a first cartridge including a chamber for receiving liquid from the liquid source, and a nozzle assembly through which the liquid is dispensed, said cartridge being mounted in said housing and being slideably movable relative to the housing between a lower first position in which said nozzle assembly of said cartridge dispenses the liquid, and an upper second position at which said cartridge does not dispense the liquid, wherein when in the lower first position, the nozzle assembly is spaced a predetermined distance above the medium;
   a controller for controllably causing said cartridge to move between said first and second position;
   wherein the cartridge includes an annular piston and the housing includes an annular bushing adjacent the annular piston when said cartridge is in one of the first and second positions.

5. The system of claim 4 further comprising a spring extending from said housing to said cartridge for biasing said cartridge to one of said first position and said second position.

6. The system of claim 5, wherein the spring is a compression spring for biasing the cartridge to said first position.

7. The system of claim 4, further comprising a second cartridge mounted in the housing near the cartridge, the controller causing said second cartridge to move between an upper non-dispensing position and a lower dispensing position.

8. The system of claim 7, wherein said first cartridge and said second cartridge are independently movable.

9. The system of claim 4, further comprising means, mounted in the cartridge, for moving the liquid to the nozzle assembly, the moving means being controlled by the controller so that the moving means is activated when the cartridge is in the lower position and not activated when the cartridge is in the upper position.

10. The system of claim 4, further comprising an inlet tube connected to the cartridge and movable with the cartridge.

11. The assembly of claim 2, further comprising means for moving the housing in a two dimensional plane that is perpendicular to the direction of the motion of the cartridge relative to the housing.

12. The assembly of claim 2, wherein the cartridge is removable and insertable with respect to the housing with a snap fit connection.

* * * * *

UNITED STATES PATENT AND TRADEMARK OFFICE
CERTIFICATE OF CORRECTION

PATENT NO. : 6,082,289
DATED : July 4, 2000
INVENTOR(S) : William A. Cavallaro

It is certified that error appears in the above-indentified patent and that said Letters Patent is hereby corrected as shown below:

In claim 2, line 42, "n" should read -- in --.

Signed and Sealed this

Seventeenth Day of April, 2001

Attest:

NICHOLAS P. GODICI

Attesting Officer  Acting Director of the United States Patent and Trademark Office